US010504719B2

(12) United States Patent
Goel et al.

(10) Patent No.: US 10,504,719 B2
(45) Date of Patent: Dec. 10, 2019

(54) COOLED REFLECTIVE ADAPTER PLATE FOR A DEPOSITION CHAMBER

(71) Applicants: Ashish Goel, Bangalore (IN); Anantha Subramani, San Jose, CA (US); Maurice E. Ewert, San Jose, CA (US)

(72) Inventors: Ashish Goel, Bangalore (IN); Anantha Subramani, San Jose, CA (US); Maurice E. Ewert, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 13/789,263

(22) Filed: Mar. 7, 2013

(65) Prior Publication Data

US 2013/0284096 A1 Oct. 31, 2013

Related U.S. Application Data

(60) Provisional application No. 61/719,019, filed on Oct. 26, 2012, provisional application No. 61/638,381, filed on Apr. 25, 2012.

(51) Int. Cl.
*C23C 16/48* (2006.01)
*H01L 21/67* (2006.01)
(Continued)

(52) U.S. Cl.
CPC ...... *H01L 21/02104* (2013.01); *C23C 14/541* (2013.01); *C23C 16/482* (2013.01); *H01L 21/67115* (2013.01)

(58) Field of Classification Search
CPC .. C23C 16/541; C23C 16/4411; C23C 16/481
(Continued)

(56) References Cited

U.S. PATENT DOCUMENTS 4,837,052 A * 6/1989 Lorimer ................. C04B 41/52
427/124
5,090,712 A * 2/1992 Pecht .................. F16J 15/3412
277/400
(Continued)

FOREIGN PATENT DOCUMENTS

JP H08315965 A 11/1996
JP H091677742 A 6/1997
(Continued)

OTHER PUBLICATIONS

International Search Report, PCT Application: PCT/US2013/033353, dated Jul. 24, 2013.
(Continued)

*Primary Examiner* — Charlee J C Bennett
(74) *Attorney, Agent, or Firm* — Patterson + Sheridan, LLP

(57) ABSTRACT

In one embodiment, an adapter plate for a deposition chamber is provided. The adapter plate comprises a body, a mounting plate centrally located on the body, a first annular portion extending longitudinally from a first surface of the mounting plate and disposed radially inward from an outer surface of the mounting plate, a second annular portion extending longitudinally from an opposing second surface of the mounting plate and disposed radially inward from the outer surface of the mounting plate, and a mirror-finished surface disposed on the interior of the first annular portion, the mirror-finished surface having an average surface roughness of 6 Ra or less.

19 Claims, 12 Drawing Sheets

(51) Int. Cl.
*H01L 21/02* (2006.01)
*C23C 14/54* (2006.01)

(58) Field of Classification Search
USPC .................................................. 118/715–733
See application file for complete search history.

(56) References Cited

U.S. PATENT DOCUMENTS

| | | | | |
|---|---|---|---|---|
| 5,125,359 | A * | 6/1992 | Barale | C23C 16/46 |
| | | | | 118/725 |
| 5,419,029 | A * | 5/1995 | Raaijmakers | B23P 11/025 |
| | | | | 204/298.11 |
| 5,561,735 | A * | 10/1996 | Camm | C23C 16/481 |
| | | | | 118/725 |
| 5,564,735 | A * | 10/1996 | Boy | B60R 21/21 |
| | | | | 280/730.2 |
| 5,690,795 | A * | 11/1997 | Rosenstein | H01L 21/67017 |
| | | | | 118/504 |
| 6,352,593 | B1 * | 3/2002 | Brors | C23C 16/44 |
| | | | | 118/724 |
| 6,482,301 | B1 | 11/2002 | Chen et al. | |
| 6,740,196 | B2 | 5/2004 | Lee et al. | |
| 6,780,294 | B1 * | 8/2004 | Hixson | C23C 14/564 |
| | | | | 118/504 |
| 6,806,172 | B1 * | 10/2004 | Woo | H01L 21/324 |
| | | | | 257/385 |
| 6,821,378 | B1 * | 11/2004 | Daugherty | H01J 37/32449 |
| | | | | 118/715 |
| D665,071 | S | 8/2012 | Goel et al. | |
| D665,491 | S | 8/2012 | Goel et al. | |
| 9,051,649 | B2 * | 6/2015 | Lai | C23C 14/541 |
| 2001/0054381 | A1 * | 12/2001 | Umotoy | C23C 16/4401 |
| | | | | 118/715 |
| 2003/0015421 | A1 | 1/2003 | Cha et al. | |
| 2004/0020759 | A1 * | 2/2004 | Lawson | C23C 14/3407 |
| | | | | 204/192.1 |
| 2005/0146257 | A1 * | 7/2005 | Trujillo | H01K 1/58 |
| | | | | 313/17 |
| 2006/0032741 | A1 | 2/2006 | Lawson et al. | |
| 2007/0082507 | A1 | 4/2007 | Iyer et al. | |
| 2007/0295602 | A1 * | 12/2007 | Tiller | H01J 37/32623 |
| | | | | 204/298.11 |
| 2008/0041625 | A1 | 2/2008 | Cheong et al. | |
| 2008/0257263 | A1 * | 10/2008 | Pavloff | C22C 21/00 |
| | | | | 118/723 R |
| 2009/0071406 | A1 * | 3/2009 | Choi | C03C 17/002 |
| | | | | 118/724 |
| 2009/0308739 | A1 | 12/2009 | Riker et al. | |
| 2010/0151695 | A1 * | 6/2010 | Masaki | F27B 17/0025 |
| | | | | 438/795 |
| 2011/0070635 | A1 * | 3/2011 | King | F24S 10/72 |
| | | | | 435/292.1 |
| 2011/0217848 | A1 * | 9/2011 | Bergman | H01L 21/31133 |
| | | | | 438/746 |
| 2012/0231633 | A1 * | 9/2012 | Ewert | C23C 14/541 |
| | | | | 438/763 |

FOREIGN PATENT DOCUMENTS

| | | |
|---|---|---|
| JP | 10-012551 | 1/1998 |
| JP | 2008227001 A | 9/2008 |
| JP | 2010166033 A | 7/2010 |
| KR | 20010051571 A | 6/2001 |
| KR | 20120031122 A | 3/2012 |

OTHER PUBLICATIONS

Chinese Office Action for Application No. 201380021867.9 dated Aug. 2, 2016.
Japanese Office Action for Application No. 2015-508977 dated Jan. 31, 2017.
Notice of Allowance for Korean Application No. 10-2014-7032960 dated Sep. 25, 2019.

* cited by examiner

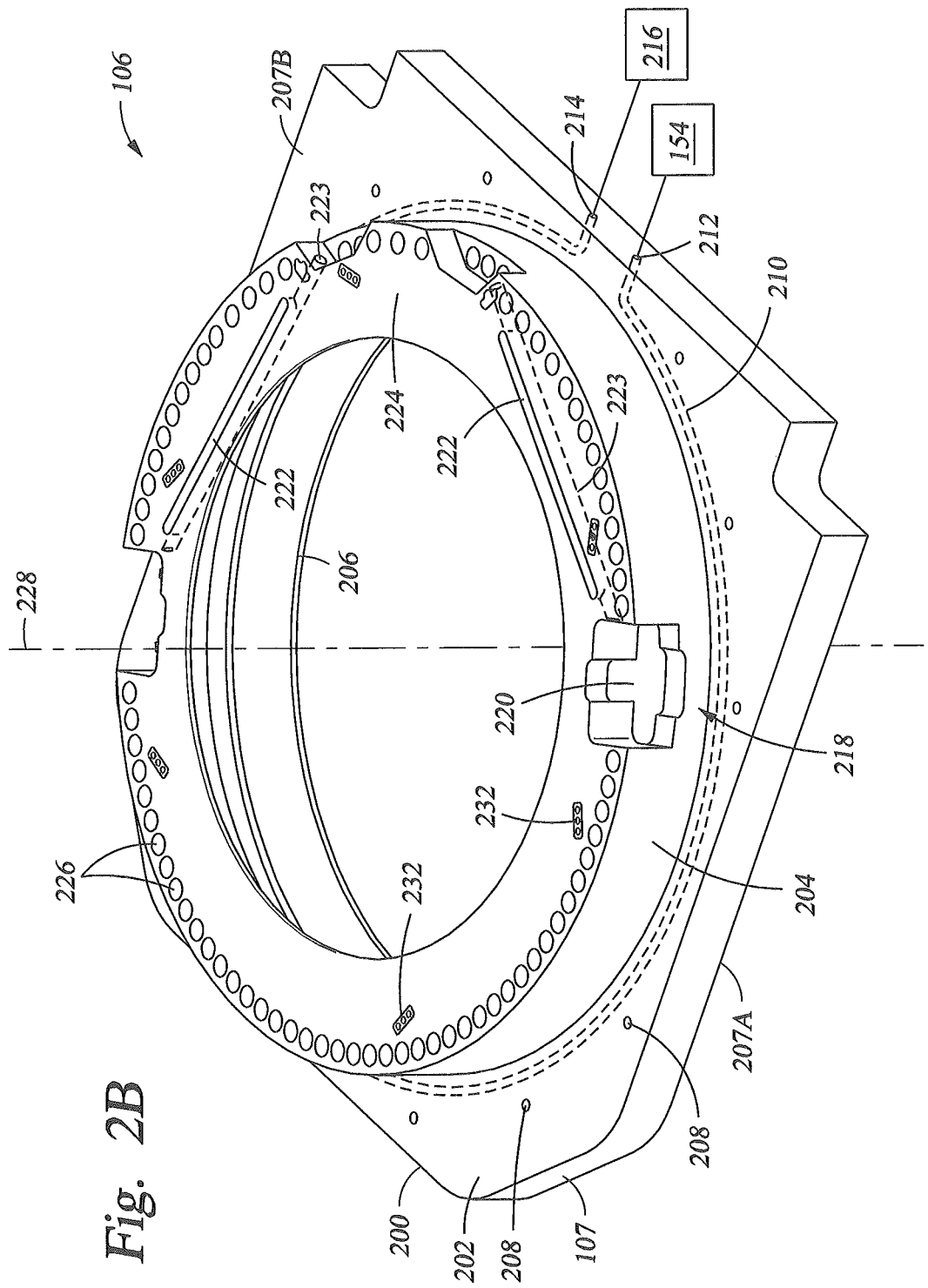

COOLED REFLECTIVE ADAPTER PLATE FOR A DEPOSITION CHAMBER

CROSS-REFERENCE TO RELATED APPLICATIONS

This application claims benefit of U.S. Provisional Patent Application Ser. No. 61/638,381, filed Apr. 25, 2012, and U.S. Provisional Patent Application Ser. No. 61/719,019, filed Oct. 26, 2012, both of which applications are hereby incorporated by reference herein.

FIELD

Embodiments disclosed herein relate to semiconductor processing. More specifically, embodiments disclosed herein relate to apparatus and methods for material and thermal processing of semiconductor substrates.

BACKGROUND

Material processes and thermal processes are common in semiconductor manufacturing in order to fabricate electronic devices on a substrate. In an electronic device fabrication process, semiconductor substrates are often subjected to a material process which includes deposition, implantation, or etching, and a thermal process may be performed before, during or after the material process. In some thermal processes, substrates are heated utilizing radiant sources, such as lamps, that direct radiant energy to the substrate to anneal and/or perform a rapid thermal process (RTP) on the substrate after a material process. However, the thermal process is typically performed in a separate chamber, which requires transfer of the substrate to another chamber. During the material process the substrate may be heated. However, much of the heat energy contained in the substrate may be lost to chamber components and transfer devices, such as robot blades, which reduces efficiency of the device fabrication process and increases process time. Machine utilization, the time a machine is operating to process a substrate, is a critical factor in reducing the cost of each chip produced. Thus, there is a continuing need for more efficient semiconductor device fabrication processes and apparatus.

SUMMARY

Disclosed are methods and apparatus for treating a substrate utilizing a process chamber capable of deposition of material on a substrate. The chamber is also utilized to heat the substrate before, during or after deposition. The chamber also includes an adapter plate that includes a lamp mounting facility and a reflective surface for focusing radiant energy to a surface of the substrate.

In one embodiment, an adapter plate for a deposition chamber is provided. The adapter plate comprises a body, a mounting plate centrally located on the body, a first annular portion extending longitudinally from a first surface of the mounting plate and disposed radially inward from an outer surface of the mounting plate, a second annular portion extending longitudinally from an opposing second surface of the mounting plate and disposed radially inward from the outer surface of the mounting plate, and a mirror-finished surface disposed on the interior of the first annular portion, the mirror-finished surface having an average surface roughness of 6 Ra or less.

In another embodiment, an adapter plate for a deposition chamber is provided. The adapter plate comprises a body having a first side disposed in a first plane and a second side opposite the first side, a first sidewall coupled to the first side, the first sidewall disposed in a second plane that is substantially orthogonal to the first plane, a second sidewall coupled to the second side, the second sidewall disposed in the second plane, and an outwardly extending flange coupled intermediate of the first sidewall and the second sidewall.

In another embodiment, an adapter plate for a deposition chamber is provided. The adapter plate comprises a body comprising a first annular portion having a first side disposed in a first plane and a second annular portion having a second side disposed in the first plane opposite the first side, a first sidewall coupled to the first side, the first sidewall disposed in a second plane that is substantially orthogonal to the first plane, a second sidewall coupled to the second side, the second sidewall disposed in the second plane, and an outwardly extending flange coupled intermediate of the first sidewall and the second sidewall, the outwardly extending flange having at least a portion of a thermal control channel formed therein.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B is an isometric bottom view of the adapter plate of FIG. 2A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
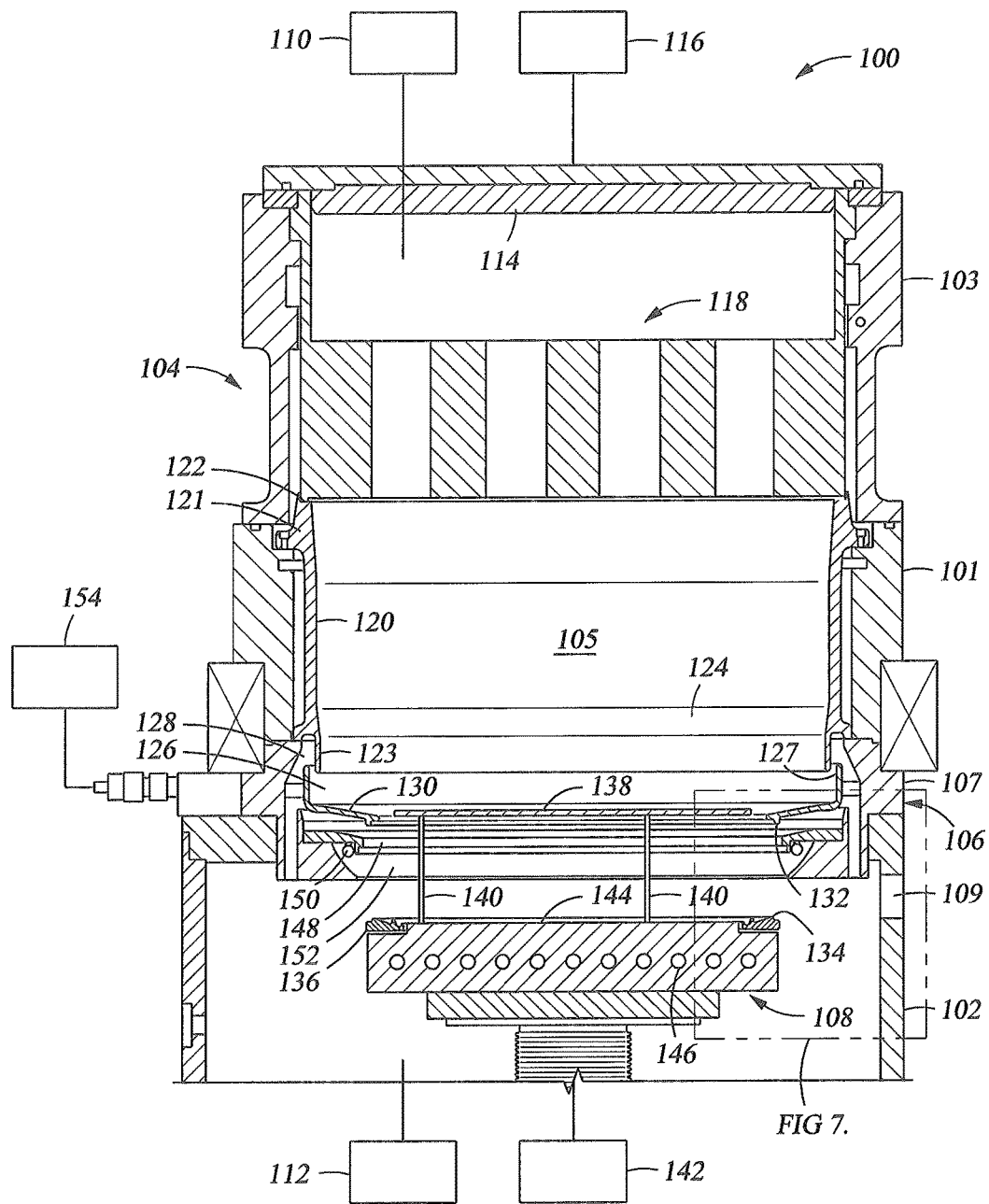
FIG. 1 is a schematic cross-sectional view of a deposition chamber according to one embodiment.

FIG. 1 is a schematic cross-sectional view of a deposition chamber 100 according to one embodiment. The deposition chamber 100 comprises a body 101 having a lower sidewall 102, an upper sidewall 103, and a lid portion 104 defining a body 101 that encloses an interior volume 105 thereof. An adapter plate 106 may be disposed between the lower sidewall 102 and the upper sidewall 103. A portion of the adapter plate 106 may include an outer surface 107 of the body 101. A substrate support, such as a pedestal 108, is disposed in the interior volume 105 of the deposition chamber 100. A substrate transfer port 109 is formed in the lower sidewall 102 for transferring substrates into and out of the interior volume 105.

In one embodiment, the deposition chamber 100 comprises a sputtering chamber, also known as a physical vapor deposition (PVD) chamber, capable of depositing, for example, titanium, aluminum oxide, aluminum, copper, tantalum, tantalum nitride, tungsten, or tungsten nitride on a substrate. Examples of suitable PVD chambers include the ALPS® Plus and SIP ENCORE® PVD processing chambers, both commercially available from Applied Materials, Inc., Santa Clara, of California. It is contemplated that processing chambers available from other manufacturers may also utilize the embodiments described herein.

In a deposition process, process gases may be flowed to the interior volume 105 from a gas source 110. The pressure of the interior volume 105 may be controlled by a pumping device 112 in communication with the interior volume 105. The lid portion 104 may support a sputtering source 114, such as a target. The sputtering source 114 may be coupled to a source assembly 116 comprising magnets and a power supply for the sputtering source 114. A collimator 118 may be positioned in the interior volume 105 between the sputtering source 114 and the pedestal 108. A shield tube 120 may be in proximity to the collimator 118 and interior of the lid portion 104. The collimator 118 includes a plurality of apertures to direct gas and/or material flux within the interior volume 105. The collimator 118 may be mechanically and electrically coupled to the shield tube 120. In one embodiment, the collimator 118 is mechanically coupled to the shield tube 120, such as by a welding process, making the collimator 118 integral to the shield tube 120. In another embodiment, the collimator 118 may be electrically floating within the chamber 100. In another embodiment, the collimator 118 may be coupled to an electrical power source and/or electrically coupled to the lid portion 104 of the deposition chamber 100.

The shield tube 120 may include a tubular body 121 having a recess 122 formed in an upper surface thereof. The recess 122 provides a mating interface with a lower surface of the collimator 118. The tubular body 121 of the shield tube 120 may include a shoulder region 123 having an inner diameter that is less than the inner diameter of the remainder of the tubular body 121. In one embodiment, the inner surface of the tubular body 121 transitions radially inward along a tapered surface 124 to an inner surface of the shoulder region 123. A shield ring 126 may be disposed in the chamber adjacent to the shield tube 120 and intermediate of the shield tube 120 and the adapter plate 106. The shield ring 126 may be at least partially disposed in a recess 128 formed by an opposing side of the shoulder region 123 of the shield tube 120. In one aspect, the shield ring 126 includes an annular portion 127 that may be axially projecting. The annular portion 127 includes an inner diameter that is greater than an outer diameter of the shoulder region 123 of the shield tube 120. A radial flange 130 extends from the annular portion 127. The radial flange 130 may be formed at an angle greater than about ninety degrees (90°) relative to the inside diameter surface of the annular portion 127 of the shield ring 126. The radial flange 130 includes a protrusion 132 formed on a lower surface thereof. The protrusion 132 may be a circular ridge extending from the surface of the radial flange 130 in an orientation that is substantially parallel to the inside diameter surface of the annular portion 127 of the shield ring 126. The protrusion 132 is generally adapted to mate with a recessed flange 134 formed in an edge ring 136 disposed on the pedestal 108. The recessed flange 134 may be a circular groove formed in the edge ring 136. The edge ring 136 may be utilized as a deposition ring during a reflow process or a silicidation process. The edge ring 136 may include one or more reflective surfaces that focus energy toward a substrate surface. The engagement of the protrusion 132 and the recessed flange 134 centers the shield ring 126 with respect to the longitudinal axis of the pedestal 108. The substrate 138 (shown supported on lift pins 140) is centered relative to the longitudinal axis of the pedestal 108 by coordinated positioning calibration between the pedestal 108 and a robot blade (not shown). In this manner, the substrate 138 may be centered within the deposition chamber 100 and the shield ring 126 may be centered radially about the substrate 138 during processing.

In operation, a robot blade (not shown) having a substrate 138 thereon is extended through the substrate transfer port 109. The pedestal 108 may be lowered to allow the substrate 138 to be transferred to the lift pins 140 extending from the pedestal 108. Lifting and lowering of the pedestal 108 and/or the lift pins 140 may be controlled by a drive 142 coupled to the pedestal 108. The substrate 138 may be lowered onto a substrate receiving surface 144 of the pedestal 108. With the substrate 138 positioned on the substrate receiving surface 144 of the pedestal 108, sputter deposition may be performed on the substrate 138. The edge ring 136 may be electrically isolated from the substrate 138 during processing. Therefore, the substrate receiving surface 144 may include a height that is greater than a height of portions of the edge ring 136 adjacent the substrate 138 such that the substrate 138 is prevented from contacting the edge ring 136. During sputter deposition, the temperature of the substrate 138 may be controlled by utilizing thermal control channels 146 disposed in the pedestal 108. Additionally, components of the deposition chamber 100 adjacent the substrate 138 during deposition are configured to provide an optimized volumetric gas flow. The gaps between components and through-holes formed in the adapter plate 106 (shown in FIG. 2A as through-holes 226) form a plurality of conductance zones that provide a conductance value (i.e., conductance ratio (e.g., inverse of flow resistance in terms L/D)) of about 7.54 to about 11.2 at about 400 degrees Celsius (° C.).

After sputter deposition, the substrate 138 may be elevated utilizing the lift pins 140 to a position that is spaced away from the pedestal 108. The elevated location may be proximate one or both of the shield ring 126 and a reflector ring 148 adjacent to the adapter plate 106. The adapter plate 106 includes one or more lamps 150 coupled thereto intermediate of a lower surface of the reflector ring 148 and a reflective surface 152 of the adapter plate 106. The reflective surface 152 may be curved or concave. The lamps 150 provide radiant energy in the visible or near visible wavelengths, such as in the infra-red (IR) and/or ultraviolet (UV) spectrum. The radiant energy from the lamps 150 is focused toward the backside (i.e., lower surface) of the substrate 138 to heat the substrate 138 and the material deposited thereon. Reflective surfaces on the chamber components surrounding the substrate 138, such as the reflective surface 152 of the adapter plate 106, and reflective surfaces of the edge ring 136, serve to focus the radiant energy toward the backside of the substrate 138 and away from other chamber components where the energy would be lost and/or not utilized. The adapter plate 106 may be coupled to a coolant source 154 to control the temperature of the adapter plate 106 during heating.

The substrate 138 may be heated to a first temperature of about 300° C. to about 400° C., such as about 350° C., in a few seconds. Heating of the substrate 138 to the first temperature may enable a reflow process or a silicidation process. The reflow process is utilized to reduce overhang of metal in recesses of the substrate 138. The silicidation process may be utilized to drive reactions between metal and silicon.

The heating method described herein has advantages with respect to a metal deposition process. When metal is deposited on a substrate surface, the surface gains reflectivity. Absorption of radiant energy is generally reduced on a metalized surface. Irradiation of the metalized surface is less effective than heating the surface opposite the metalized surface, for example the substrate back side. Improved energy absorption of silicon improves energy efficiency of the thermal treatment process, as opposed to the heating the metalized surface.

After heating the substrate to the first temperature, the substrate 138 is lowered to a position on the substrate receiving surface 144 of the pedestal 108. The substrate 138 may be rapidly cooled utilizing the thermal control channels 146 in the pedestal 108 via conduction. The temperature of the substrate may be ramped down from the first temperature to a second temperature in a matter of seconds to a minute. The second temperature may be about room temperature, such as about 23° C. to about 30° C., for example, about 25° C. The substrate 138 may be removed from the deposition chamber 100 through the substrate transfer port 109 for further processing.

Figure 2A:
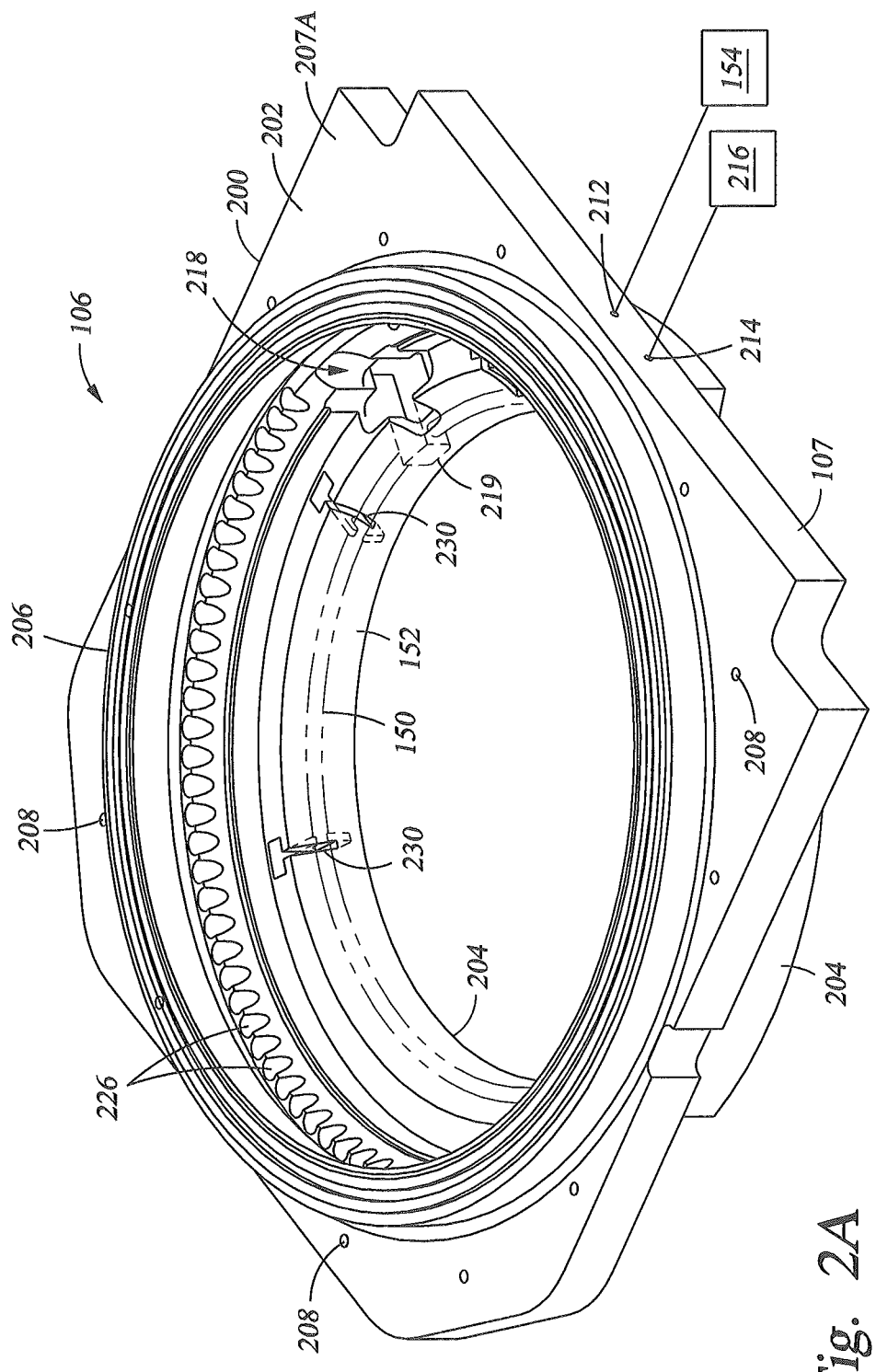
FIG. 2A is an isometric top view of the adapter plate of FIG. 1.
Figure 2C:
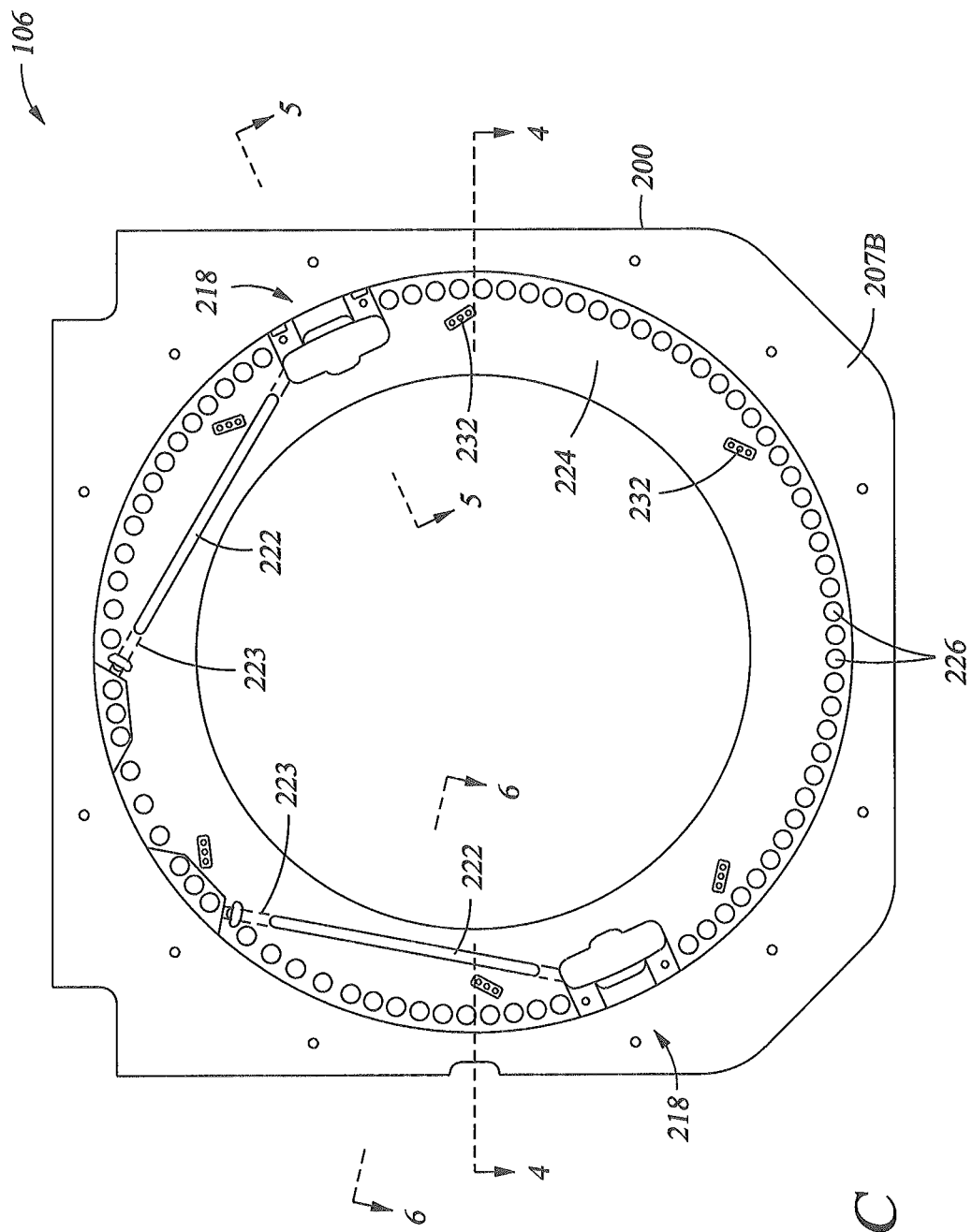
FIG. 2C is a bottom plan view of the adapter plate of FIG. 2A.

FIG. 2A is an isometric top view of the adapter plate 106 of FIG. 1. FIG. 2B is an isometric bottom view of the adapter plate 106 of FIG. 2A. FIG. 2C is a bottom plan view of the adapter plate 106 of FIG. 2A. The adapter plate 106 includes a body 200 having a flange 202, which may comprise an outer surface 107 of the chamber 100 of FIG. 1. The flange 202 may be a mounting plate that is centrally located and extending radially from a first annular portion 204 and a second annular portion 206. Each of the first annular portion 204 and the second annular portion 206 may be disposed radially inward of the outer surface 107 of the flange 202. The flange 202 may include openings 208 formed between a first surface 207A and an opposing second surface 207B. The openings 208 are utilized for fasteners (not shown) to facilitate coupling of the body 200 to the deposition chamber 100 (shown in FIG. 1). The flange 202 may also include a thermal control channel 210 formed therein (shown in phantom in FIG. 2B). The thermal control channel 210 is coupled to a coolant source 154 at an inlet 212 of the thermal control channel. An outlet 214 of the thermal control channel 210 may be coupled to a reservoir 216, which may be a heat exchanger or a drain. The body 200 may be fabricated from a metallic material, such as aluminum.

Referring to FIG. 2B, the body 200 may comprise one or more radial recesses 218 formed at least partially in the first annular portion 204. Each of the radial recesses 218 may include an opening 220 formed through the first annular portion 204. The radial recesses 218 are utilized for a lamp mounting device 219 for holding and providing power to a lamp 150 (both are shown in FIG. 2A in phantom). Each of the lamps 150 may be U-shaped and the ends of the lamps 150 interface with a socket disposed on the lamp mounting device 219. Each of the radial recesses 218 may also include an elongated channel 222 formed in an inwardly extending surface 224 of the first annular portion 204. The elongated channel 222 is utilized for attachment of electrical cables to the lamp mounting device 219 disposed in the radial recesses 218. A bore 223 may be formed in the first annular portion 204 to provide access for cables from an exterior of the body 200 to the elongated channel 222, and to the radial recesses 218.

In one aspect, each of the radial recesses 218 are disposed at opposing sides of the body 200 (e.g., about 180 degrees from one another) to support ends of a semi-circular lamp. The elongated channel 222 may be formed as a substantially linear groove that is tangential to a radius of the inwardly extending surface 224 of the first annular portion 204. The first annular portion 204 may also include a plurality of through-holes 226 formed through the inwardly extending surface 224 of the first annular portion 204. Each of the through-holes 226 include a centerline that may be parallel to a longitudinal axis 228 of the body 200. The through-holes 226 are utilized for optimized volumetric flow (i.e., increased gas conductance) during processing. Each of the through-holes 226 may include a diameter of about 0.40 inches to about 0.54 inches and the first annular portion 204 may include about 30 to about 70 through-holes 226. During processing, flow in the gap between the reflector ring 148 and the radial flange 130 in combination with flow through the through-holes 226 provide a combined conductance value of about 14.22 at about 400 degrees C.

The body 200 may also include a plurality of slots 230 formed in the reflective surface 152 (shown in FIG. 2A). The slots 230 are configured to couple to a support member 300 (shown in FIG. 3) that supports the lamp 150. The inwardly extending surface 224 of the first annular portion 204 may also include a plurality of axial recesses 232. The axial recesses 232 are utilized to receive a fastener fixture 305 (shown in FIG. 3) to secure the support member 300. Each of the slots 230 may be spaced at intervals of about 40 degrees to about 60 degrees from each other.

In one embodiment, the reflective surface 152 is concave and includes a smooth surface. The reflective surface 152 may be formed on a radius of about 8 inches. In one aspect, the reflective surface 152 has a surface roughness (average surface roughness (Ra)) of about 6 or less. In one embodiment, the reflective surface 152 comprises a reflectance of about 85 percent (%) at an angle of incidence of about 85 degrees. In another embodiment, the reflective surface 152 comprises a reflectance of about 72% at an angle of incidence of about 20 degrees. In another embodiment, the reflective surface 152 comprises a reflectance of about 72% at an angle of incidence of about 60 degrees.

Figure 3:
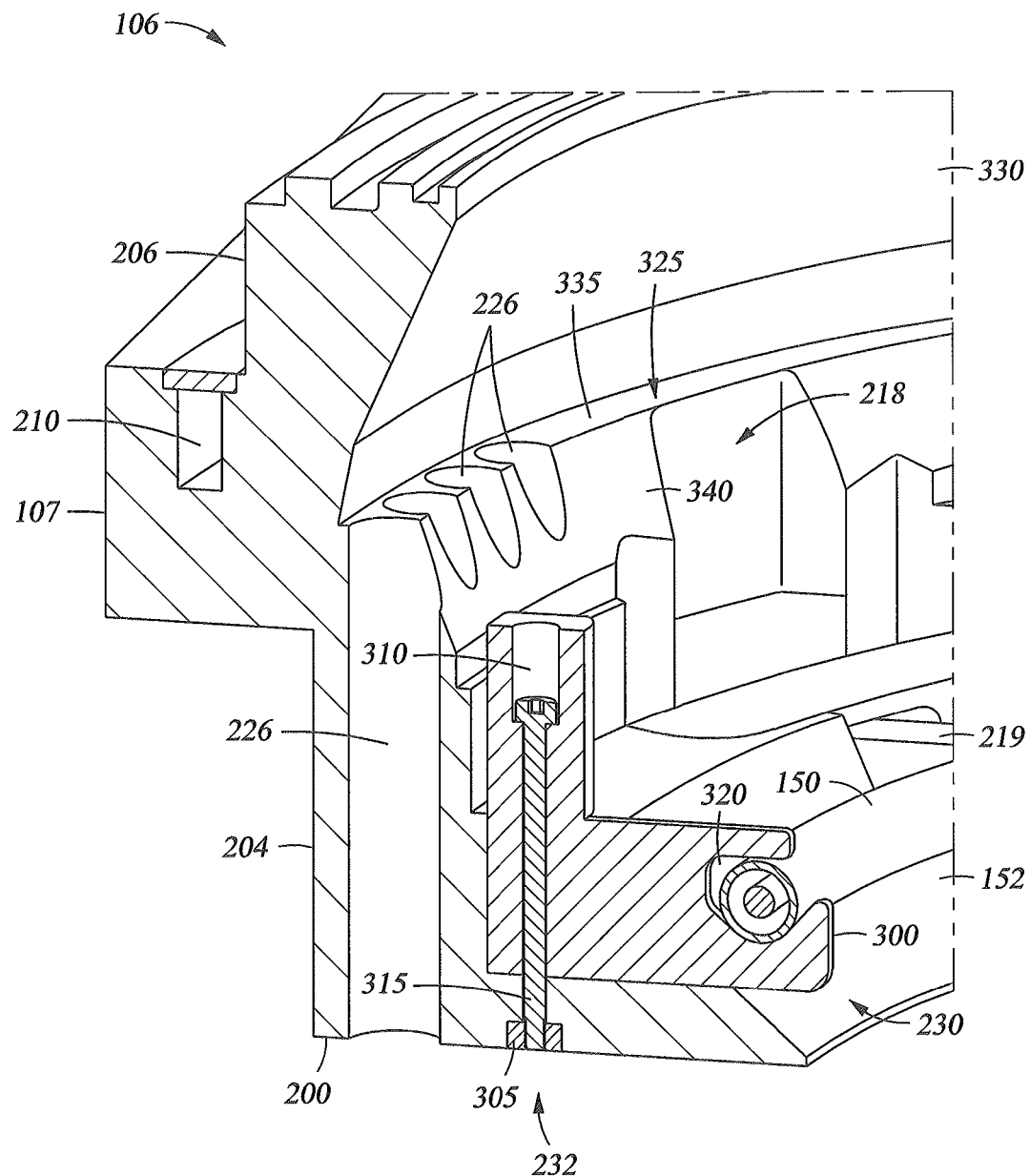
FIG. 3 is a partial cross sectional view of the body of the adapter plate of FIG. 2A.

FIG. 3 is a partial cross sectional view of the body 200 of the adapter plate 106 of FIG. 2A. A support member 300 is shown in cross-section and is disposed in a slot 230. The support member 300 includes a through-hole 310 that receives a fastener 315. The fastener 315 is secured to a fastener fixture 305 that is received in the axial recess 232. The support member 300 also includes a slot 320 that receives the outside diameter of the lamp 150 and at least partially supports the lamp 150. The body 200 also includes an interior shelf portion 325 that is adjacent a converging portion 330. The interior shelf portion 325 comprises a first interior surface 335 and a second interior surface 340. The first interior surface 335 is disposed in a first plane and the second interior surface 340 is disposed in a plane that is about 30 degrees to about 60 degrees relative to the plane of the first interior surface 335. At least a portion of the through-holes 226 are formed in each of the first interior surface 335 and the second interior surface 340 of the interior shelf portion 325.

Figure 4:
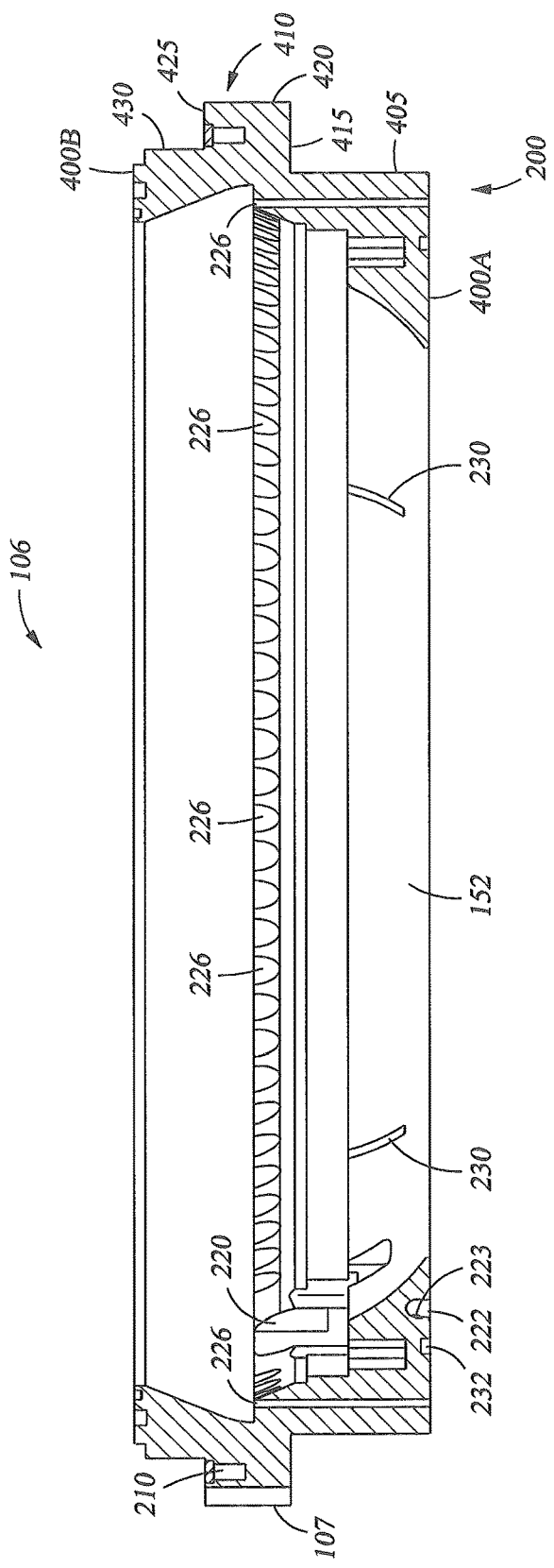
FIG. 4 is a side cross-sectional view of the adapter plate of FIG. 2A along lines 4-4 of FIG. 2C.

FIG. 4 is a side cross-sectional view of the adapter plate 106 of FIG. 2A along lines 4-4 of FIG. 2C. The body 200 of the adapter plate 106 comprises a lower surface, such as a first side 400A, and an upper surface, such as a second side 400B. A portion of the elongated channel 222 is shown in the first side 400A. The body 200 includes other openings (not shown) formed therein to provide routing of electrical cables from the elongated channel 222 to the lamp mounting device 219 (shown in FIG. 2A). The first side 400A and the second side 400B are generally parallel. The first side 400A transitions to a lower sidewall surface, such as a first sidewall 405, that is substantially normal to the plane of the first side 400A. The first sidewall 405 transitions to an outwardly extending flange 410. The outwardly extending flange 410 includes a lower surface, such as a first mounting surface 415, an exterior sidewall surface 420 and an upper surface, such as a second mounting surface 425. The first mounting surface 415 couples to the exterior sidewall surface 420 at an angle that is substantially normal relative to the plane of the first mounting surface 415. The exterior sidewall surface 420 couples to the second mounting surface 425 at an angle that is substantially normal relative to the plane of the exterior sidewall surface 420. Thus, the first mounting surface 415 and the second mounting surface 425 are substantially parallel. Likewise, the first mounting surface 415 and the second mounting surface 425 are substantially parallel with planes of the first side 400A and/or the second side 400B. The second mounting surface 425 transitions to an upper sidewall surface, such as a second sidewall 430, at an angle that is substantially normal relative to the plane of the second mounting surface 425. Thus, the first sidewall 405 is substantially parallel to the second sidewall 430.

Figure 5:
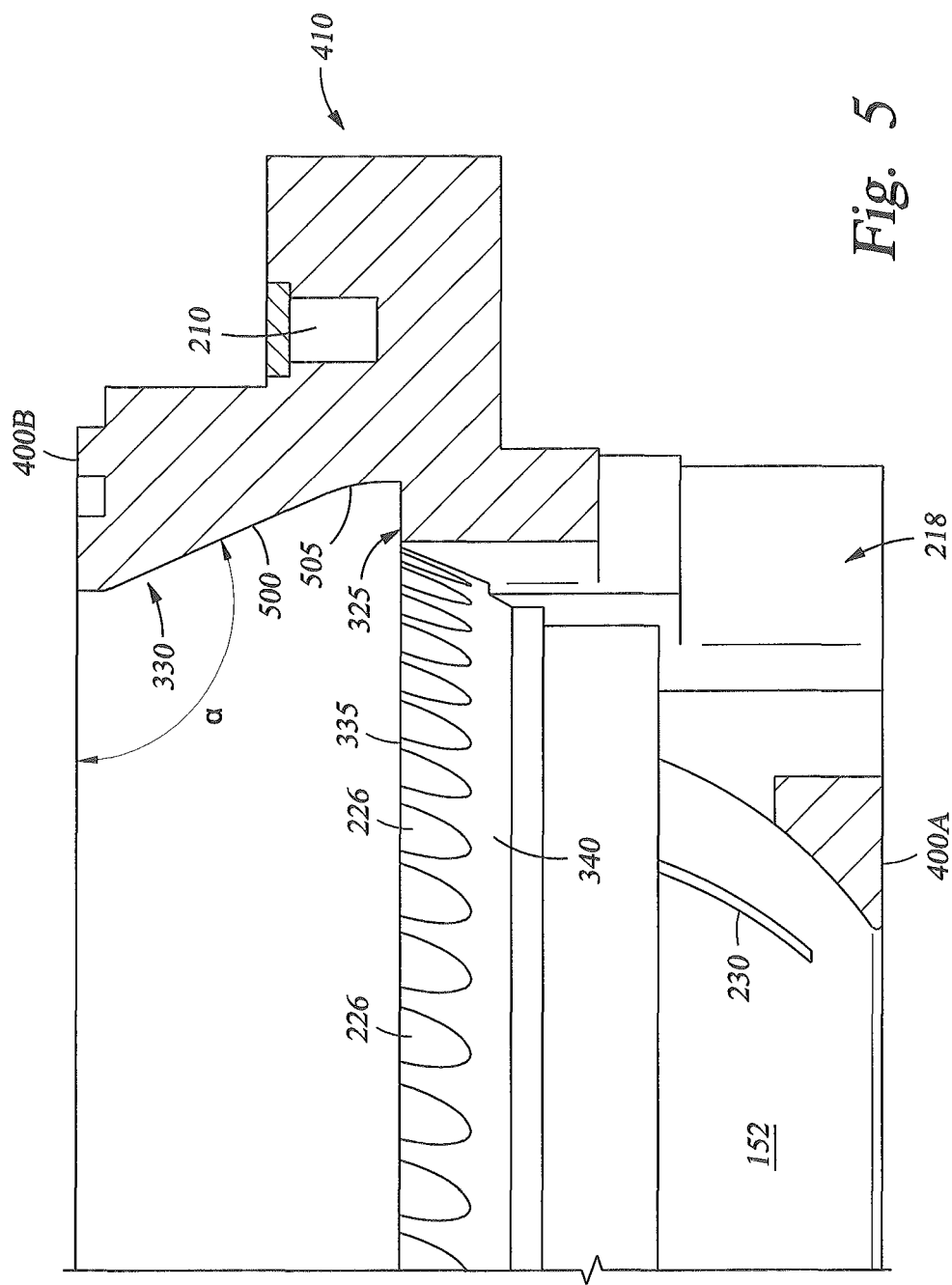
FIG. 5 is a side cross-sectional of the adapter plate of FIG. 2A along lines 5-5 of FIG. 2C.

FIG. 5 is a side cross-sectional of the adapter plate 106 of FIG. 2A along lines 5-5 of FIG. 2C. As described in FIG. 3, the body 200 of the adapter plate 106 comprises an interior shelf portion 325 having the through holes formed at least partially therein. The interior shelf portion 325 comprises the first interior surface 335 that may be substantially parallel to the plane of the first side 400A and/or the second side 400B of the body 200. The first interior surface 335 transitions to the converging portion 330 which includes a planar surface 500. In one embodiment, the planar surface 500 is disposed at an obtuse angle α relative to a plane of the second side 400B. The angle α may be about 100 degrees to about 120 degrees. In another embodiment, the first interior surface 335 may transition to the converging portion 330 by a concave intersection 505, which may be a radius of about 1 inch.

Figure 6:
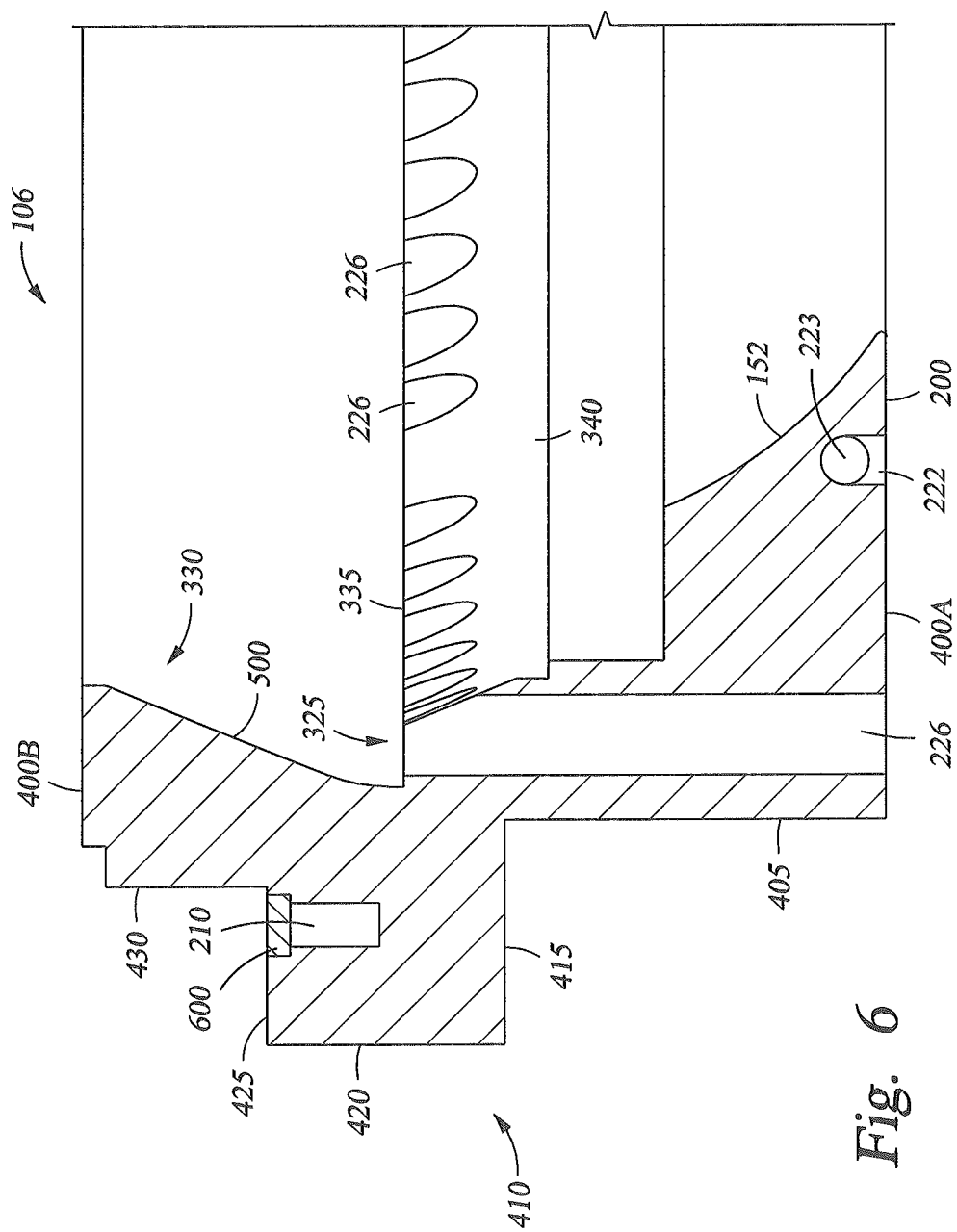
FIG. 6 is a side cross-sectional view of the adapter plate of FIG. 2A along lines 6-6 of FIG. 2C.

FIG. 6 is a side cross-sectional view of the adapter plate 106 of FIG. 2A along lines 6-6 of FIG. 2C. In this view, the elongated channel 222 is shown through the body 200. One of the through-holes 226 is also shown formed through the body 200. Also shown is a cap plate 600 disposed on the thermal control channel 210. The cap plate 600 may be formed from aluminum and be fastened to the body 200 by welding.

Figure 7:
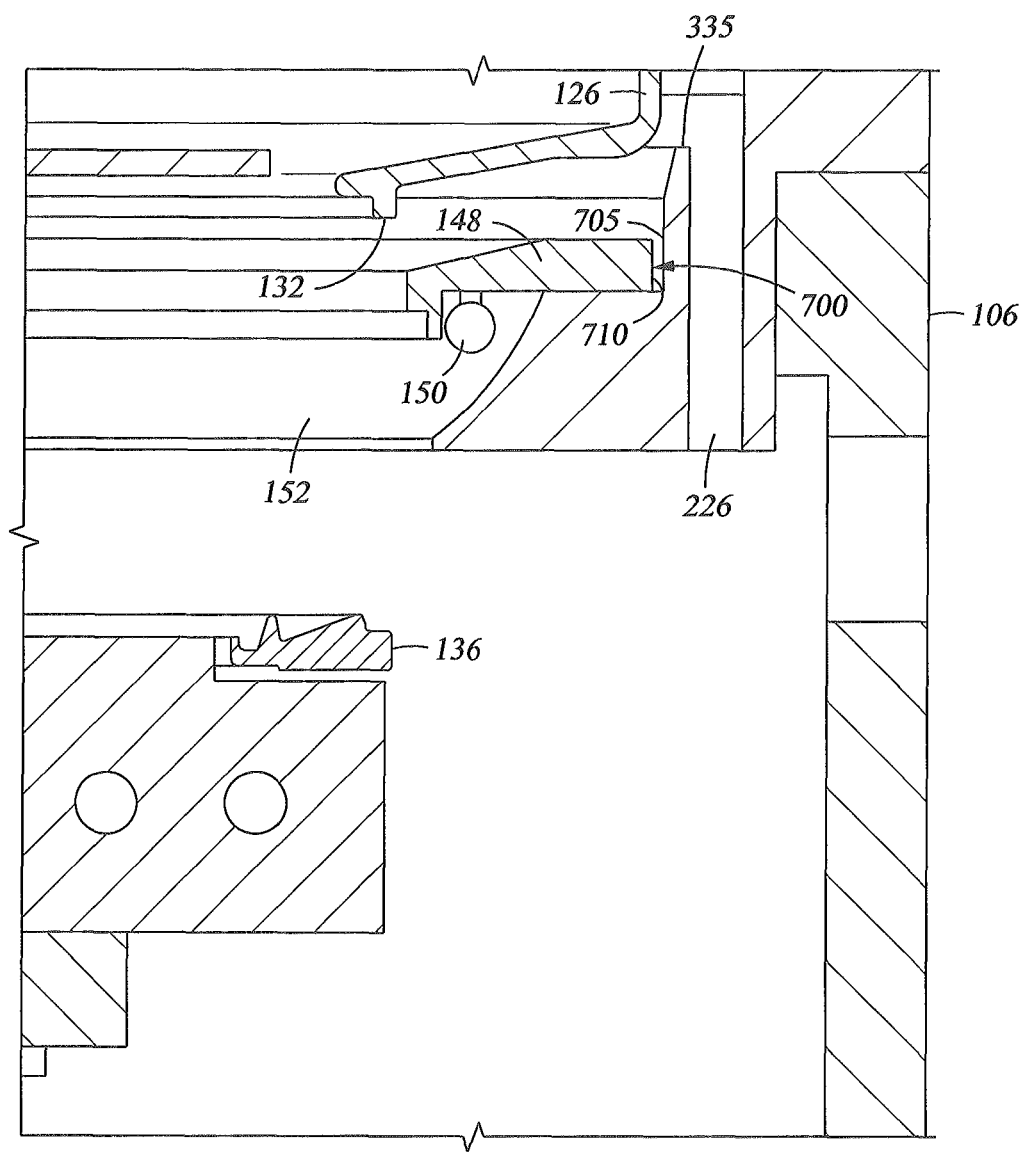
FIG. 7 is an enlarged sectional view of a portion of the adapter plate and the shield ring of FIG. 1.

FIG. 7 is an enlarged sectional view of a portion of the adapter plate 106, the reflector ring 148, and the shield ring 126. In one embodiment, the reflector ring 148 rests on a surface of the adapter plate 106 adjacent the reflective surface 152 and the lamp 150. In one aspect, a gap 700 is provided between an inner surface 705 of the adapter plate 106 and an outer surface 710 of the reflector ring 148. The inner surface 705 may include a dimension (e.g., diameter) that is slightly greater than a diameter of the outer surface 710 such that the gap 700 is continuous about the periphery of the reflector ring 148. During processing, the reflector ring 148 may be heated from energy from the lamp 150, which may cause the reflector ring 148 to expand. The gap 700 allows free expansion until the gap 700 is consumed. Any additional heat input will result in decreased contact resistance between the reflector ring 148 and the surfaces of the adapter plate 106 which transfers heat away from the reflector ring 148. In one aspect, the gap 700 is a self-limiting mechanism that limits the maximum temperature of the reflector ring 148 to about 100 degrees C., or less, during processing.

Figure 8A:
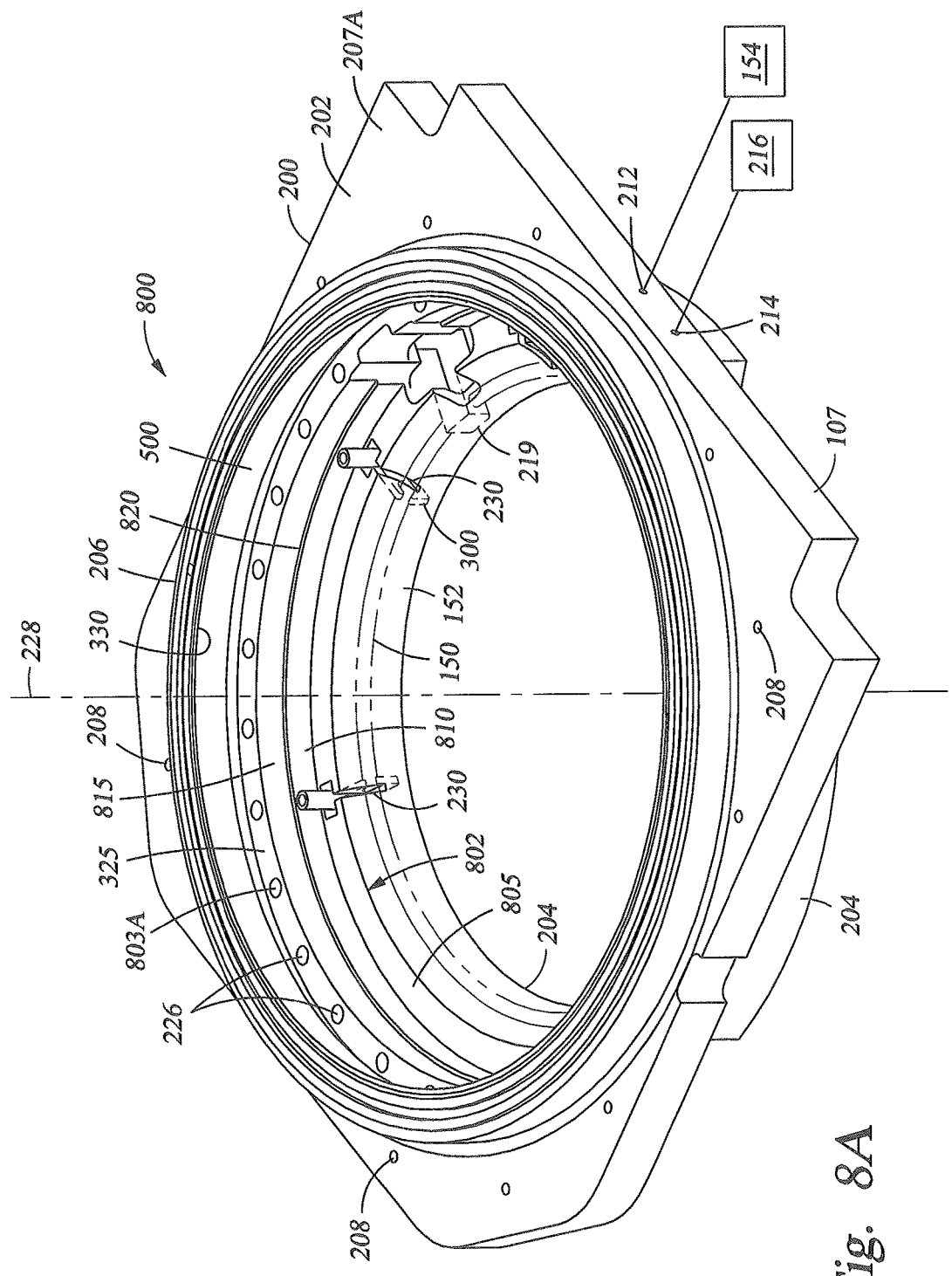
FIG. 8A is an isometric top view of another embodiment of an adapter plate which may be utilized in the deposition chamber of FIG. 1.
Figure 8B:
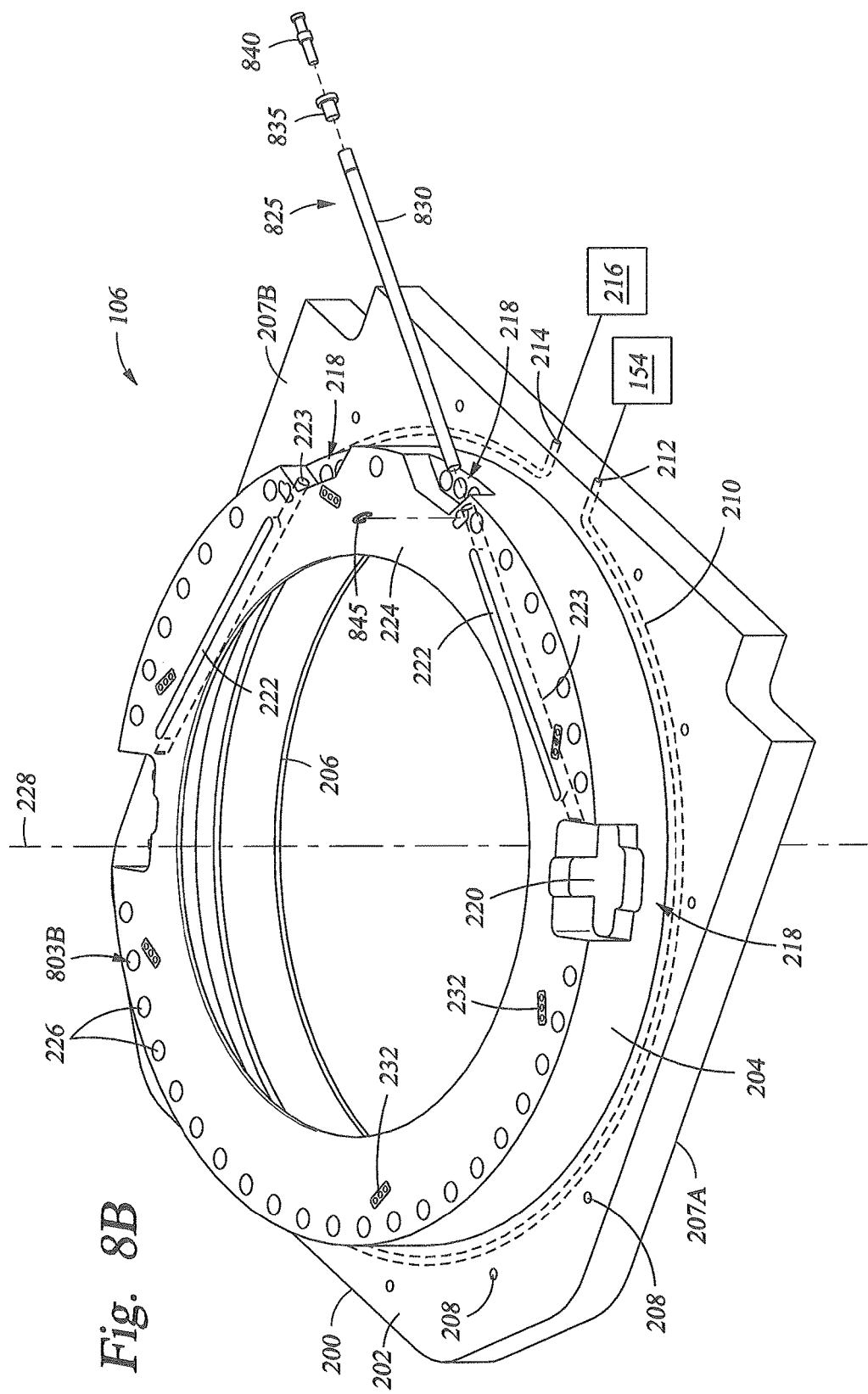
FIG. 8B is an isometric bottom view of the adapter plate of FIG. 8A.

FIG. 8A is an isometric top view of another embodiment of an adapter plate 800, which may be utilized in the deposition chamber 100 of FIG. 1. FIG. 8B is an isometric bottom view of the adapter plate 800 of FIG. 8A. The adapter plate 800 is similar to the adapter plate 106 described in FIGS. 2A-7 with a few exceptions, and some of the reference numerals common to the adapter plate 800 and the adapter plate 106 will not be explained for brevity.

In this embodiment, the adapter plate 800 includes the reflective surface 152 and lamps 150 (shown in phantom) that are disposed in support members 300. The adapter plate 800 also includes a stepped interior portion 802 disposed between the reflective surface 152 and the interior shelf portion 325. Additionally, the through-holes 226 are formed completely within the interior shelf portion 325. In this embodiment, first openings 803A of the through-holes 226 include a circular shape as opposed to a partial elliptical shape as described in the adapter plate 106 shown in FIGS. 2A-7.

The stepped interior portion 802 includes a first shoulder portion 805 disposed between the reflective surface 152 and a first interior wall 810. The first shoulder portion 805 extends radially outward from the reflective surface 152 and interfaces with the first interior wall 810 at a substantially normal angle (e.g., 85 degrees to 95 degrees). A second interior wall 815, which has a radial dimension (e.g., distance from the longitudinal axis 228) that is slightly greater than a radial dimension of the first interior wall 810, interfaces with the interior shelf portion 325 at a substantially normal angle. A chamfer 820 may be disposed between the first interior wall 810 and the second interior wall 815.

FIG. 8B is an isometric bottom view of the adapter plate 800 of FIG. 8A. Second openings 803B of the through-holes 226 are shown on the inwardly extending surface 224 of the first annular portion 204. Also shown are two elongated channels 222 formed in an inwardly extending surface 224 of the first annular portion 204. Each of the elongated channels 222 include the bore 223 where an electrical connector 825 may be disposed. The electrical connector 825 includes a conduit 830 having a cap 835 and a plug 840. The conduit 830 houses wires and electrical connectors that provide an electrical power connection for the lamp mounting device 219 (shown in FIG. 2A) and the lamps 150 (shown in FIG. 8A). The electrical connector 825 is secured in the first annular portion 204 by a retainer 845.

Figure 9:
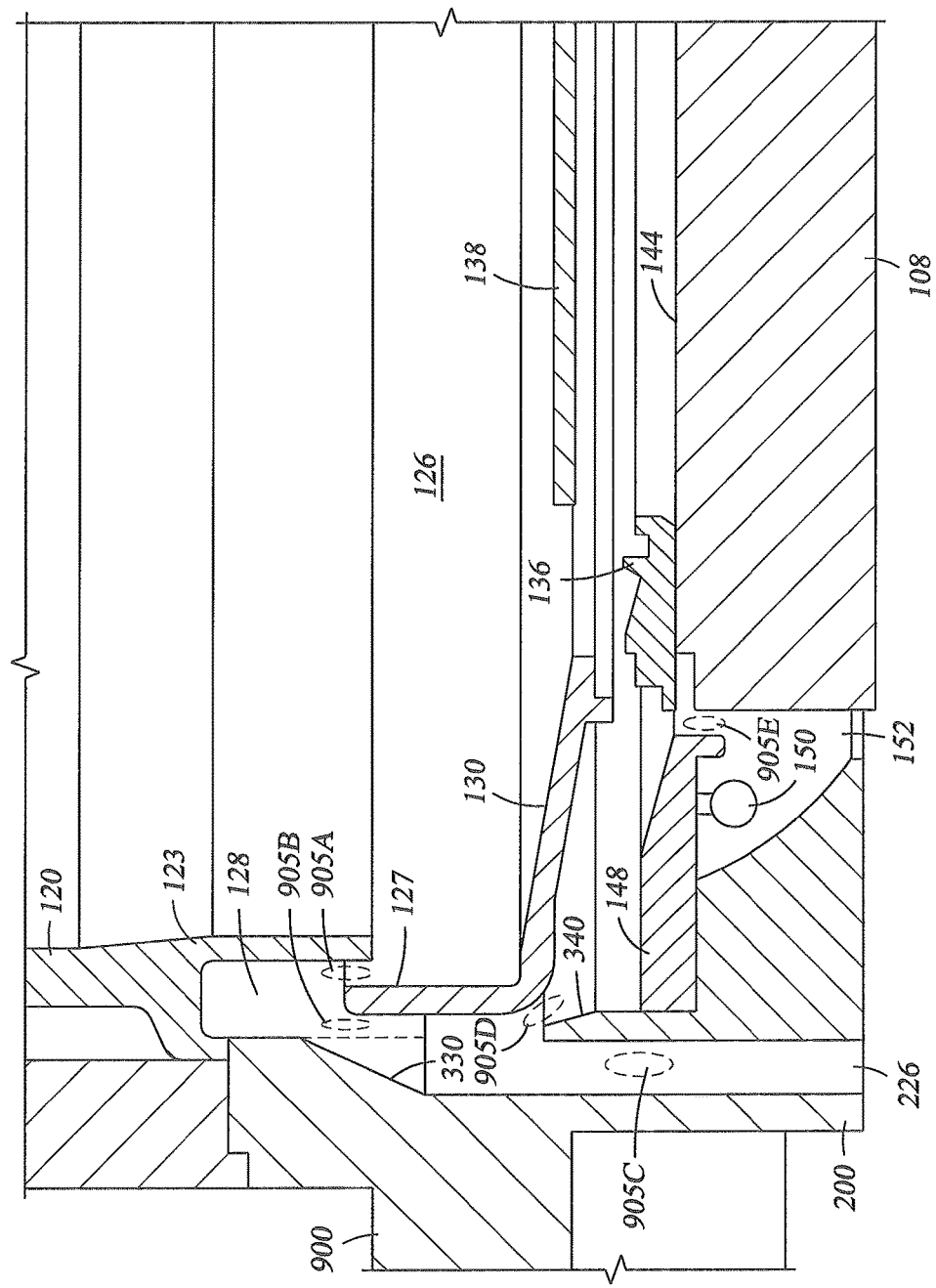
FIG. 9 is a schematic side cross-sectional view of a portion of an adapter plate showing various conductance zones formed in, and between, the adapter plate and adjacent components.

FIG. 9 is a schematic side cross-sectional view of a portion of an adapter plate 900 showing various conductance zones 905A-905E formed in, and between, the adapter plate 900 and adjacent components, according to embodiments of the adapter plate 106 of FIGS. 2A-7, or the adapter plate 800 of FIGS. 8A and 8B. A first conductance zone 905A is formed between a perimeter of the annular portion 127 of the shield ring 126 and a peripheral surface of the shoulder region 123 of the shield tube 120. A second conductance zone 905B is formed in a space between surfaces of the converging portion 330 of the body 200 of the adapter plate 900 and an outer surface of the periphery of the annular portion 127 of the shield ring 126. A third conductance zone 905C is formed in the through-holes 226 (only one is shown). A fourth conductance zone 905D is formed between the second interior surface 340 of the body 200 of the adapter plate 106 and an outer peripheral surface of the shield ring 126. A fifth conductance zone 905E is formed between an inner peripheral surface of the reflector ring 148 and an outer surface of a body of the pedestal 108. Spacing between the surfaces of adjacent components that form the conductance zones 905A, 905B, 905D, 905E, as well as the dimensions of the components (such as the diameter of the through-holes 226), may be provided to produce a desired conductance, which optimizes pressure during processing.

Testing of the deposition chamber 100 was conducted and total conductance values for the zones 905A-905E were calculated from resistance values of each of the zones 905A-905E at various process conditions, such as the distance between the sputtering source 114 and the substrate 138 (both shown in FIG. 1), as well as the approximate temperature of the shield ring 126. In tabulating the results of testing, the conductance zones 905D and 905E are considered in parallel to conductance zone 905C, and are added to conductance zones 905A, 905B, in series.

Exemplary conductance values of the adapter plate 106 of FIGS. 2A-7 are as follows. One test result, conducted with the approximate temperature of the shield ring 126 being about 400 degrees Celsius and a spacing between the sputtering source 114 and the substrate 138 being about 393 mm, yielded a total conductance of about 1.56. Another test result, conducted with the approximate temperature of the shield ring 126 being about 25 degrees Celsius and a spacing between the sputtering source 114 and the substrate 138 being about 393 mm, yielded a total conductance of about 2.96. Another test result, conducted with the approximate temperature of the shield ring 126 being about 400 degrees Celsius and a spacing between the sputtering source 114 and the substrate 138 being about 405 mm, yielded a total conductance of about 2.073.

Exemplary conductance values of the adapter plate 800 of FIGS. 8A and 8B are as follows. One test result, conducted with the approximate temperature of the shield ring 126 being about 400 degrees Celsius and a spacing between the sputtering source 114 and the substrate 138 being about 393 mm, yielded a total conductance of about 7.534. Another test result, conducted with the approximate temperature of the shield ring 126 being about 25 degrees Celsius and a spacing between the sputtering source 114 and the substrate 138 being about 393 mm, yielded a total conductance of about 6.678. Another test result, conducted with the approximate temperature of the shield ring 126 being about 400 degrees Celsius and a spacing between the sputtering source 114 and the substrate 138 being about 405 mm, yielded a total conductance of about 11.136.

While the foregoing is directed to embodiments of the invention, other and further embodiments of the invention may be devised without departing from the basic scope thereof.

What is claimed is:

1. An adapter plate for a deposition chamber, the adapter plate comprising:
   a body disposed along a central longitudinal axis, the body comprising:
   a first annular portion and a second annular portion centrally located about the longitudinal axis;
   a mounting plate extending outwardly from, and located centrally relative to, both of the first annular portion and the second annular portion, the first annular portion having a first sidewall extending orthogonally from a first mounting surface of the mounting plate along the longitudinal axis of the body and disposed radially inward from an outer surface of the mounting plate, the first annular portion extending inwardly from a second sidewall of the second annular portion, wherein the first annular portion includes a plurality of through-holes formed therethrough in a direction parallel to the longitudinal axis, wherein the second annular portion extends from an opposing second mounting surface of the mounting plate along the longitudinal axis and radially inward from the outer surface of the mounting plate, the second annular portion having an interior surface, a portion of the interior surface being disposed in a plane that is angled inwardly toward the longitudinal axis and having an opening for each of the plurality of through-holes formed therein, wherein a bore is formed in the first annular portion in a tangential relation to the longitudinal axis of the body, and the bore is coupled to a radial recess and is configured to receive an electrical connector, wherein a linear groove is connected to the bore and the radial recess includes an opening to receive a lamp mounting device;
   a mirror-finished surface disposed on an interior of the first annular portion; and
   a plurality of slots formed in the mirror-finished surface, each of the plurality of slots having a length aligned with the longitudinal axis.

2. The adapter plate of claim 1, wherein the mirror-finished surface comprises a reflectance of about 70 percent to about 90 percent.

3. The adapter plate of claim 2, wherein the mirror-finished surface is curved.

4. The adapter plate of claim 2, wherein the mirror-finished surface comprises a reflectance of about 85 percent at an angle of incidence of about 85 degrees.

5. The adapter plate of claim 2, wherein the mirror-finished surface comprises a reflectance of about 72 percent.

6. The adapter plate of claim 1, wherein the body comprises:
   a first side surface disposed in a first plane and a second side surface opposite the first side surface; and
   a first sidewall coupled to the first side surface, the first sidewall disposed in a second plane that is substantially orthogonal to the first plane.

7. The adapter plate of claim 6, wherein the body further comprises:
   a second sidewall coupled to the second side surface, the second sidewall disposed parallel to the second plane; and
   an outwardly extending flange coupled intermediate of the first sidewall and the second sidewall.

8. The adapter plate of claim 1, wherein the body includes a thermal control channel formed therein.

9. The adapter plate of claim 8, wherein the thermal control channel substantially circumscribes one or both of the first annular portion and the second annular portion.

10. The adapter plate of claim 8, wherein the thermal control channel comprises a cap plate forming one side of the thermal control channel.

11. An adapter plate for a deposition chamber, the adapter plate comprising:
a body having a first side disposed in a first plane and a second side opposite the first side;
a first sidewall coupled to the first side, the first sidewall disposed in a second plane that is substantially orthogonal to the first plane, the first sidewall having a plurality of radial recesses including an opening formed therethrough in a radial direction relative to a longitudinal axis of the body configured to receive a lamp mounting device, and each of the plurality of radial recesses are connected to a bore formed in the body in a tangential relation to the longitudinal axis, one of the radial recesses being spaced by about 180 degrees from another of the radial recesses, wherein the body further includes a plurality of through-holes formed in the first sidewall in a direction parallel to the longitudinal axis, and a plurality of axial recesses and a linear groove are formed in the first sidewall, the linear groove being positioned in a tangential relation to the longitudinal axis, wherein the linear groove is connected to the bore and the bore extends between the opening and the first sidewall;
a second sidewall coupled to the second side, the second sidewall disposed parallel to the second plane; and
a flange coupled intermediate of the first sidewall and the second sidewall and extending radially outward of both of the first sidewall and the second sidewall.

12. The adapter plate of claim 11, wherein the second side is parallel to the first plane.

13. The adapter plate of claim 12, wherein the first sidewall comprises a first annular portion and the second sidewall comprises a second annular portion.

14. The adapter plate of claim 13, wherein the first annular portion and the second annular portion comprise an interior shelf portion.

15. The adapter plate of claim 13, wherein an interior surface of the second annular portion comprises a planar surface opposite the second sidewall that angles inwardly toward the longitudinal axis of the body.

16. The adapter plate of claim 12, wherein the body comprises a thermal control channel formed at least partially in the outwardly extending flange.

17. An adapter plate for a deposition chamber, the adapter plate comprising:
a body comprising a first annular portion having a first side disposed in a first plane and a second annular portion having a second side parallel to the first plane and opposite the first side, wherein a plurality of axial recesses configured to receive a fastener fixture and a bore adapted to receive an electrical connector, and an elongated channel to receive electrical cables is formed in in an inwardly extending surface of the first annular portion;
a first sidewall coupled to the first side, the first sidewall disposed in a second plane that is substantially orthogonal to the first plane, and a plurality of through-holes formed in the first sidewall in a direction parallel to a longitudinal axis of the body;
a second sidewall coupled to the second side, the second sidewall disposed parallel to the second plane; and
a flange coupled intermediate of the first sidewall and the second sidewall and extending radially outward of both of the first sidewall and the second sidewall, the outwardly extending flange having at least a portion of a thermal control channel formed therein, wherein the second annular portion comprises a planar surface that is disposed at an obtuse angle relative to the second side, and wherein the first annular portion includes a radial recess having an opening formed through the first annular portion in a radial direction relative to the longitudinal axis of the body, the opening adapted to receive a lamp mounting device, wherein the bore and the elongated channel are connected and extend between the opening and the first sidewall.

18. The adapter plate of claim 17, wherein the first annular portion includes an interior surface comprising a mirror-finished surface.

19. The adapter plate of claim 18, wherein the mirror-finished surface includes an average surface roughness of 6 Ra or less.

* * * * *